US008148230B2

(12) United States Patent
Dunton et al.

(10) Patent No.: US 8,148,230 B2
(45) Date of Patent: Apr. 3, 2012

(54) METHOD OF MAKING DAMASCENE DIODES USING SELECTIVE ETCHING METHODS

(75) Inventors: Vance Dunton, San Jose, CA (US); Raghuveer S. Makala, Sunnyvale, CA (US); Michael Chan, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 311 days.

(21) Appl. No.: 12/656,306

(22) Filed: Jan. 25, 2010

(65) Prior Publication Data
US 2011/0014771 A1 Jan. 20, 2011

Related U.S. Application Data

(60) Provisional application No. 61/213,785, filed on Jul. 15, 2009.

(51) Int. Cl.
*H01L 21/20* (2006.01)
(52) U.S. Cl. .................. 438/385; 257/E21.219
(58) Field of Classification Search .................. 438/385, 438/748; 257/E21.219, E21.606
See application file for complete search history.

(56) References Cited

U.S. PATENT DOCUMENTS

| 7,629,247 B2 * | 12/2009 | Hsia et al. ................ 438/621 |
| 7,927,977 B2 * | 4/2011 | Makala et al. ............. 438/478 |
| 2005/0052915 A1 | 3/2005 | Herner et al. |
| 2006/0258076 A1 | 11/2006 | Mizushima et al. |
| 2008/0099840 A1 | 5/2008 | Enicks |
| 2008/0099882 A1 | 5/2008 | Enicks |
| 2008/0113469 A1 | 5/2008 | Eun et al. |
| 2008/0185570 A1 | 8/2008 | Wu et al. |
| 2008/0210922 A1 | 9/2008 | Lee et al. |
| 2009/0039334 A1 | 2/2009 | Chae et al. |
| 2009/0098703 A1 | 4/2009 | Ha et al. |

FOREIGN PATENT DOCUMENTS

| EP | 1276148 A2 | 1/2003 |
| EP | 1696441 A1 | 8/2006 |
| JP | 6-334139 A | 12/1994 |

OTHER PUBLICATIONS

International Search Report and Written Opinion issued in PCT Application No. PCT/US2010/041830, mailed on Nov. 10, 2011.

* cited by examiner

*Primary Examiner* — Lex Malsawma
(74) *Attorney, Agent, or Firm* — The Marbury Law Group, PLLC

(57) ABSTRACT

A method of making a semiconductor device includes providing an insulating layer containing a plurality of openings, forming a first conductivity type semiconductor layer in the plurality of openings, forming a second conductivity type semiconductor layer over the first conductivity type semiconductor layer in the plurality of openings, and selectively etching the second conductivity type semiconductor layer using an upper surface of the first conductivity type semiconductor layer as a stop to form a recess in the plurality of openings.

4 Claims, 8 Drawing Sheets

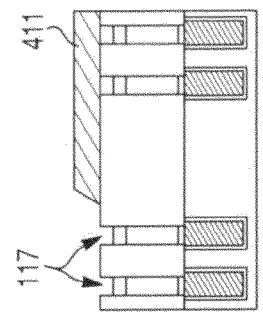
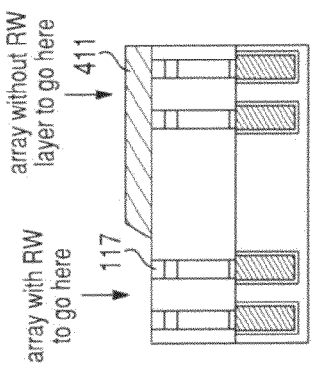
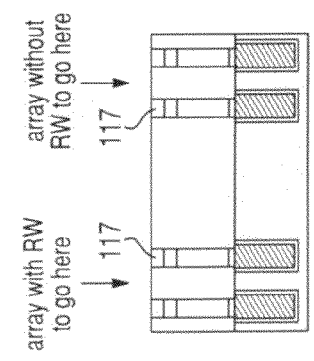
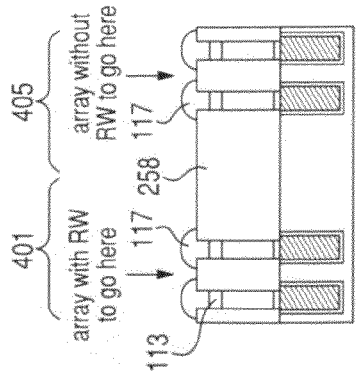
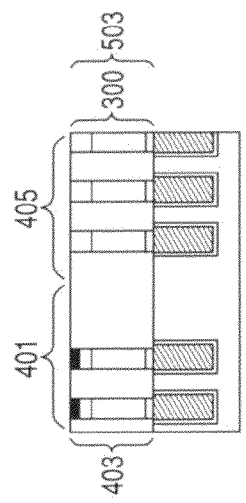
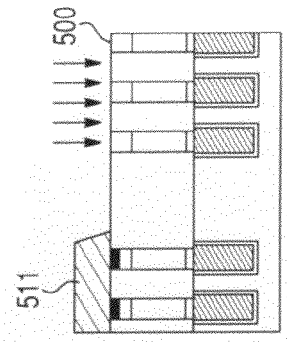
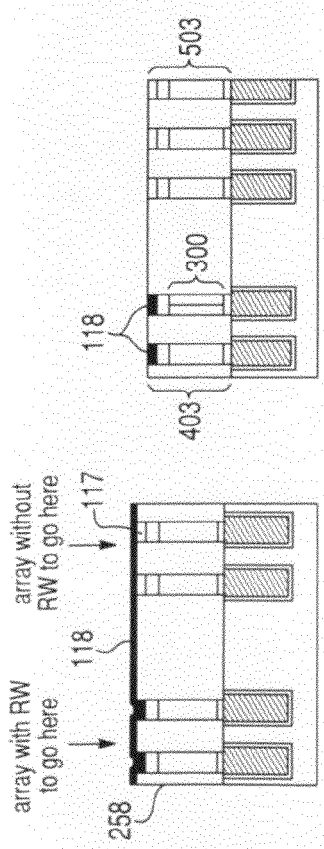

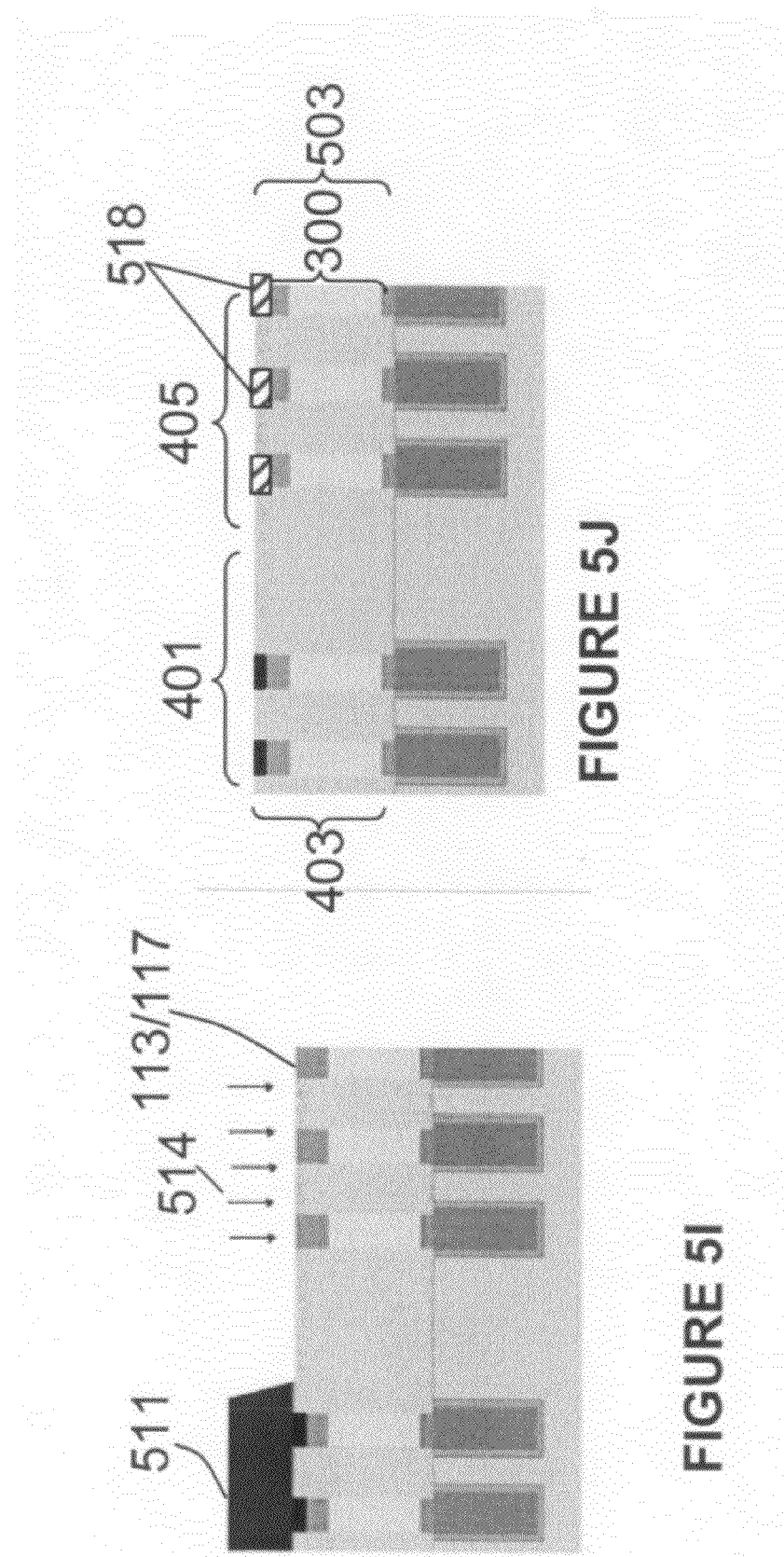

US 8,148,230 B2

METHOD OF MAKING DAMASCENE DIODES USING SELECTIVE ETCHING METHODS

CROSS-REFERENCE TO RELATED PATENT APPLICATION

The present application claims benefit of U.S. provisional application 61/213,785, filed Jul. 15, 2009, which is incorporated herein by reference in its entirety.

The present invention relates generally to the field of semiconductor device processing, and specifically to a method of making a non-volatile memory device.

BACKGROUND

Herner et al., U.S. patent application Ser. No. 10/955,549 filed Sep. 29, 2004 (which corresponds to US Published Application 2005/0052915 A1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Non-volatile Memory Cell Comprising a Reduced Height Vertical Diode," filed Dec. 17, 2004. However, in the subtractive method, the height of the semiconductor pillar may be limited by thin and soft photoresist used as the etching mask. The photoresist mask material etches at a slower rate than the semiconductor material, but etches nonetheless, and some mask material must remain when the semiconductor etch is completed. The oxide gap filling step after pillar etch presents a processing challenge when the aspect ratios of the openings between the pillars increases and/or the CMP process or etchback of the gap fill layer removes a significant thickness of the deposited semiconductor material.

SUMMARY

One embodiment of this invention provides a method of making a semiconductor device, including providing an insulating layer containing a plurality of openings, forming a first conductivity type semiconductor layer in the plurality of openings, forming a second conductivity type semiconductor layer over the first conductivity type semiconductor layer in the plurality of openings, and selectively etching the second conductivity type semiconductor layer using an upper surface of the first conductivity type semiconductor layer as a stop to form a recess in the plurality of openings.

Another embodiment of this invention provides a method of making a semiconductor device, including providing an insulating layer containing a plurality of openings, forming a p-type semiconductor layer in the plurality of openings, forming an intrinsic or n-type semiconductor layer over the p-type semiconductor layer in the plurality of openings, and selectively etching the intrinsic or n-type semiconductor layer using an upper surface of the p-type semiconductor layer as a stop to form a recess in the plurality of openings.

Another embodiment of this invention provides a method of making a semiconductor device, including providing an insulating layer containing a plurality of openings, forming an intrinsic semiconductor layer in the plurality of openings, forming an n-type semiconductor layer over the intrinsic semiconductor layer in the plurality of openings, and selectively etching the n-type semiconductor layer using an upper surface of the intrinsic semiconductor layer as a stop to form a recess in the plurality of openings.

BRIEF DESCRIPTION OF THE DRAWINGS

FIGS. 5a to 5h are side cross-sectional views illustrating stages in formation of a semiconductor device according to an embodiment of the present invention.

FIGS. 5i and 5j are side cross-sectional views illustrating stages in formation of a semiconductor device according to an alternative embodiment of the present invention.

DETAILED DESCRIPTION OF THE PREFERRED EMBODIMENTS

Figure 1A:
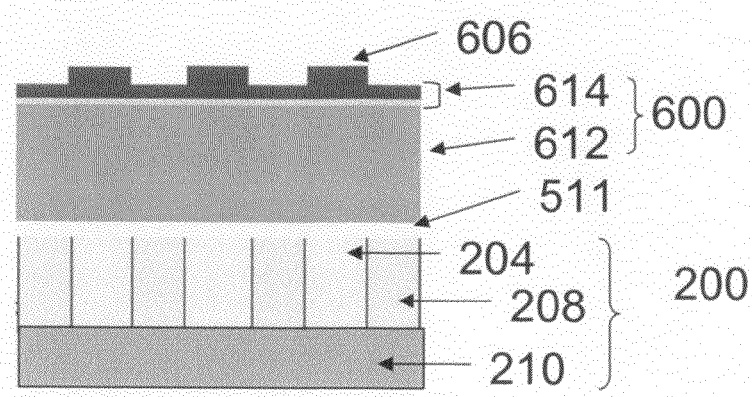
FIGS. 1a to 1h are side cross-sectional views illustrating stages in formation of a semiconductor device according to an embodiment of the present invention.

One embodiment of this invention provides a method of making a semiconductor device, including providing an insulating layer containing a plurality of openings, forming a first conductivity type semiconductor layer in the plurality of openings, forming a second conductivity type semiconductor layer over the first conductivity type semiconductor layer in the plurality of openings, and selectively etching the second conductivity type semiconductor layer using an upper surface of the first conductivity type semiconductor layer as a stop to form a recess in the plurality of openings.

Optionally, a step of chemical mechanical polishing the second conductivity type semiconductor layer using an upper surface of the insulating layer as a stop may be conducted prior to the step of selectively etching the second conductivity type semiconductor layer.

In some embodiments, a storage material layer may be formed over the first conductivity type semiconductor layer in the plurality of openings to form a storage element of a non-volatile memory device. In these embodiments, the first conductivity type semiconductor layer forms a part of a diode steering element of the memory device.

The first conductivity type semiconductor layer in the plurality of openings may be formed by steps comprising providing a plurality of seed material portions, each seed material portion of the plurality of seed material portions being exposed in a corresponding opening of the plurality of openings in the insulating layer, and selectively growing the first conductivity type semiconductor layer in the plurality of openings over the exposed seed material portions.

In some embodiments, the steps of providing the insulating layer containing the plurality of openings and providing the plurality of seed material portions exposed in the plurality of openings in the insulating layer comprise forming a seed material layer over an underlying layer, forming a second layer comprising a sacrificial material over the seed material layer, patterning the seed material layer and the second layer into a plurality of separate features, each of the plurality of separate features comprises a seed material portion of the plurality of seed material portions, forming the insulating layer between the plurality of the separate features and removing the sacrificial material from the separate features to form the plurality of openings in the insulating layer such that the seed material portions are exposed in the plurality of openings. The sacrificial material may be same or different from the seed material.

Alternatively, the steps of providing the insulating layer containing the plurality of openings and providing the plurality of seed material portions exposed in the plurality of openings in the insulating layer comprise forming a seed material layer over an underlying layer, patterning the seed material layer into the plurality of seed material portions, forming the insulating layer over and between the plurality of the seed material portions, and patterning the insulating layer to form the plurality of openings in the insulating layer such that the seed material portions are exposed in the plurality of openings.

In some other embodiments, the steps of forming the first conductivity type semiconductor layer and forming the second conductivity type semiconductor layer in the plurality of openings comprise non-selectively depositing the first conductivity type semiconductor layer in the plurality of openings and over the insulating layer, removing an upper portion of the first conductivity type semiconductor layer to form the recess in the plurality of openings, and depositing the second conductivity type semiconductor layer in the plurality of openings over remaining portions of the first conductivity type semiconductor layer.

In a first non-limiting embodiment, the first conductivity type semiconductor layer comprises a p-type silicon semiconductor layer, and the second conductivity type semiconductor layer comprises an intrinsic or n-type silicon semiconductor layer. The step of selectively etching the second conductivity type semiconductor layer comprises KOH wet etching the second conductivity type semiconductor layer using the upper surface of the first conductivity type semiconductor layer as a stop. As used herein an intrinsic semiconductor material which can be selectively etched or act as an etch stop for p-type or n-type semiconductor material is referred to as a different conductivity type from the p-type or n-type semiconductor material.

In a second non-limiting embodiment, the first conductivity type semiconductor layer comprises an intrinsic silicon semiconductor layer, and the second conductivity type semiconductor layer comprises an n-type silicon semiconductor layer. The step of selectively etching the second conductivity type semiconductor layer comprises KOH wet etching the second conductivity type semiconductor layer using the upper surface of the first conductivity type semiconductor layer as a stop.

FIGS. 1a through 1h illustrate some non-limiting embodiments using the selective etch method.

Referring to FIG. 1a, an underlying layer 200 may be formed over a substrate 210. The substrate can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device. An insulating layer (not shown) is preferably formed underneath the underlying layer 200.

In some embodiments, the underlying layer 200 may comprise a plurality of bottom electrodes 204 and an insulating material 208 separating the bottom electrodes 204. Any conducting materials known in the art, such as doped polysilicon, tungsten and/or other materials, including aluminum, tantalum, titanium, copper, cobalt, or alloys thereof, may be used. In some embodiments, the bottom electrode 204 may further comprise an adhesion layer located over/below a conducting material. For example, the bottom electrodes 204 may comprise a stack of conductive materials, for example, Ti (bottom)/Al/TiN (top), or Ti/TiN/Al/TiN, or Ti/Al/TiW, or doped polysilicon or any combination of these material. In preferred embodiments, the bottom electrodes 204 may be substantially parallel, substantially coplanar rails.

An insulating material 208, such as silicon oxide, silicon nitride, or silicon oxynitride, can then be formed over and between the bottom electrodes 204, followed by a CMP or etch back step using the top surface of the bottom electrodes 204 as a stop.

A seed layer 511 may be formed over an underlying layer 200. The seed layer 511 may be composed of any suitable seed materials, such as Si, Ge, Si—Ge alloy, or a metal silicide, for growing group IV semiconductor materials. Other seed materials may be used for growing III-V, II-VI, etc., semiconductors. The thickness of the seed layer 511 may be about 20-50 nm.

A second layer 600 may be then formed over the seed layer 511. The second layer 600 may comprise a sacrificial layer 612 composed of any suitable sacrificial materials, such as amorphous carbon, silicon nitride, or germanium. Other sacrificial materials, such as organic materials or photosensitive (e.g., photoresist) materials may be used. The second layer 600 may further comprise a hard mask layer 614 formed over the sacrificial layer 612, as shown in FIG. 1a. The hard mask layer 614 may comprise one or more of any suitable hard mask and/or anti-reflective materials, for example silicon oxide, silicon nitride, etc. In some embodiments, the hard mask layer 614 may be omitted if desired.

Finally, photoresist or similar photosensitive material features 606 are formed over the optional hard mask layer 614 (or over the sacrificial layer 612 if the hard mask layer 614 is omitted), resulting in a structure as shown in FIG. 1a. If the sacrificial layer 612 is photosensitive, the features 606 and the hard mask layer 614 may be omitted. In this embodiment, the photosensitive sacrificial layer 614 can be patterned by radiation (if layer 614 is photoresist) or electron beam (if layer 614 is an electron beam sensitive resist).

Figure 1B:
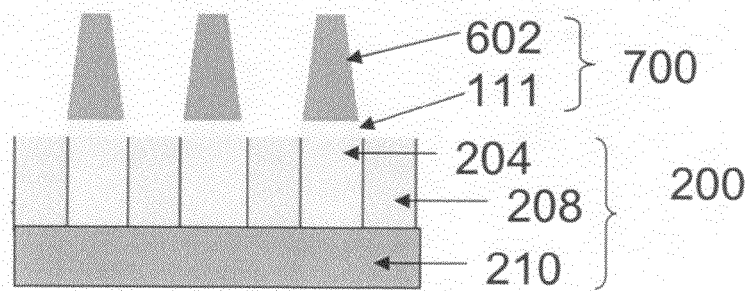

Next, the second layer 600 (e.g., the hard mask layer 614 and the sacrificial layer 612) and the seed layer 511 are etched using the photoresist features 606 as a mask to form a plurality of separated features 700. Each of the plurality of separated features 700 comprises a seed material portion 111 below a sacrificial material portion 602, as shown in FIG. 1b. The separate features 700 may have a shape of a pillar or a rail. In some embodiments, the plurality of the separate features 700 comprise cylindrical pillars having about the same pitch and about the same width as the electrodes 204 below. Some misalignment can be tolerated.

In some embodiments, the hard mask layer 614 may be completely consumed during the step of etching the stack of the sacrificial layer 612, the first layer 511 and the storage material 518. The shape of the separate features 700 may be but not necessarily tapered as they appear in FIG. 1*b*.

Alternatively, the seed layer 511 may be patterned during the same step of patterning the bottom electrodes 204, rather than being patterned in the same step of patterning the second layer 600. Therefore, in this embodiment, the resulting seed material portion 111 may have a rail shape as the bottom electrodes 204, rather than a pillar shape of the sacrificial material portions 602.

Figure 1C:
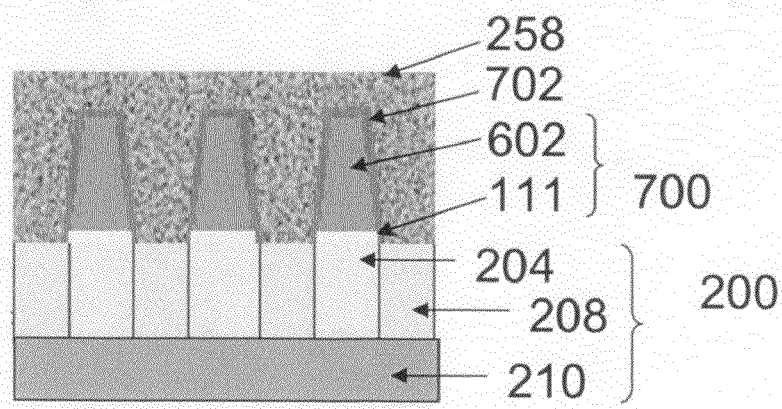

Next, turning to FIG. 1*c*, a liner 702 may be optionally formed over the plurality of the separate features 700. The liner 702 may comprise silicon nitride or other suitable insulating materials.

An insulating filling material 258 may then be formed over and between the plurality of the separate features 700, resulting in a structure as shown in FIG. 1*c*. The insulating filling material 258 may comprise an inorganic insulating material such as silicon oxide, silicon nitride, high-dielectric constant film, Si—C—O—H film, or any other suitable insulating material.

Next, this insulating filling material 258 can be planarized by CMP or etch back with the upper surface of the sacrificial material portions 602 as a stop, exposing the sacrificial material portions 602 separated by the insulating filling material 258. The sacrificial material portions 602 are then removed to form a plurality of openings 632 in the insulating filling material 258 such that the seed material portion 111 is exposed in the plurality of openings 632, resulting in a structure shown in FIG. 1*d*. The removal of the sacrificial material portions 602 may be conducted by selective etching or ashing (if the sacrificial material sections 602 comprise amorphous carbon or other suitable organic material).

Figure 1D:
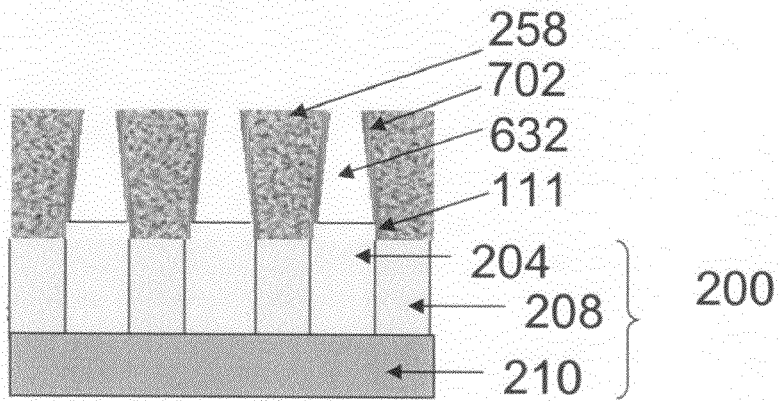
Figure 1E:
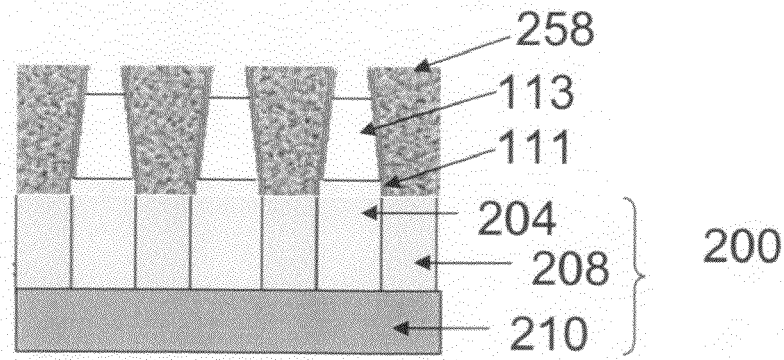

Next, a first conductivity type semiconductor layer 113 is formed over the exposed seed material 111 in the plurality of openings 632, as illustrated in FIG. 1*e*. The openings 632 may be but not necessarily partially filled as they appear in FIG. 1*e*. The first conductivity type semiconductor material 113 of the diode 300 may comprise any suitable semiconductor materials, for example, silicon, germanium, or silicon germanium alloys. The selective growth methods referred to in the below description include any suitable methods for selectively growing the corresponding semiconductor material over the seed material 111 exposed in the openings 632 (i.e., substantially not deposited over the side wall of the openings 632), such as selective CVD methods, e.g., LPCVD using silane and chlorine source gases at about 620° C. to deposit silicon. For example, the method described in U.S. application Ser. No. 11/159,031 filed on Jun. 22, 2005 (which published as US Published Application 2006/0292301 A1) and U.S. application Ser. No. 12/007,780 filed on Jan. 15, 2008, both incorporated herein by reference in their entirety, may be used to deposit germanium.

Alternatively, the steps of providing the insulating layer containing the plurality of openings and providing the plurality of seed material portions exposed in the plurality of openings in the insulating layer may be conducted by other suitable methods. For example, in another non-limiting example, the seed material layer 511 may be formed over the underlying layer 200, followed by patterning the seed material layer 511 into the plurality of seed material portions 111. The insulating layer may then be formed over and between the plurality of the seed material portions 111, and patterned to form the plurality of openings in the insulating layer such that the seed material portions 111 are exposed in the plurality of openings, resulting in a structure as shown in FIG. 1*d*.

Figure 2A:
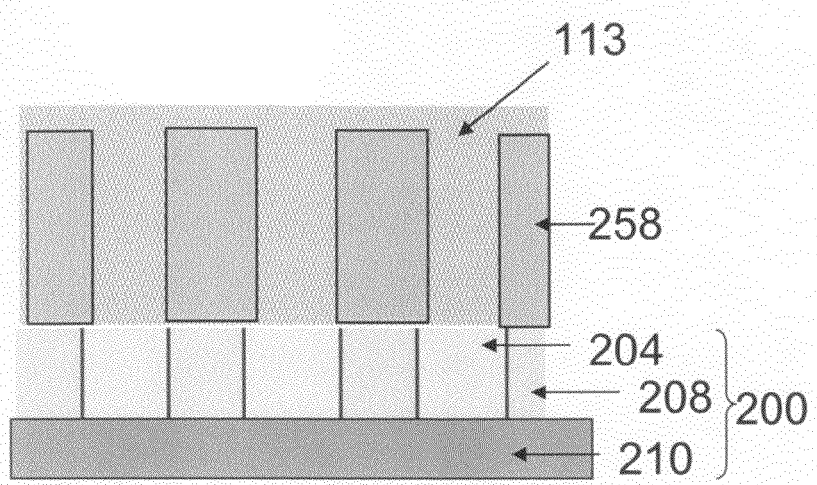
FIGS. 2a to 2b are side cross-sectional views illustrating stages in formation of a semiconductor device according to an alternative embodiment of the present invention.
Figure 2B:
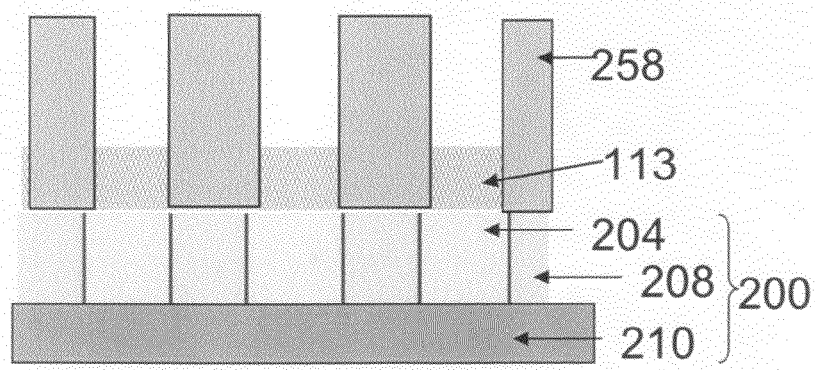

The first conductivity type semiconductor layer 113 may be formed by a non-selective deposition method rather than the selective deposition methods as described above. In these alternative embodiments, the seed layer described above may be omitted, and the first conductivity type semiconductor material may be deposited non-selectively in the plurality of openings in the insulating material 258 and over the insulating material 258, resulting a structure as shown in FIG. 2*a*. The upper portion of the first conductivity type semiconductor layer 113 may then be etched to form the recess in the plurality of openings, as shown in FIG. 2*b*. In some embodiments, a CMP step may be conducted to remove any bridged semiconductor material 113 on top of the insulating layer 258, prior to the step of etching the upper portion of the first conductivity type semiconductor layer 113 to the recess. Any other suitable methods may be used for planarizing the semiconductor material 113, for example, a standard dry etch using HBr/O$_2$ chemistry, etc. Non-selective diode deposition methods are described in U.S. application Ser. No. 12/007,781, filed Jan. 15, 2008 which is incorporated herein by reference in its entirety.

Figure 1F:
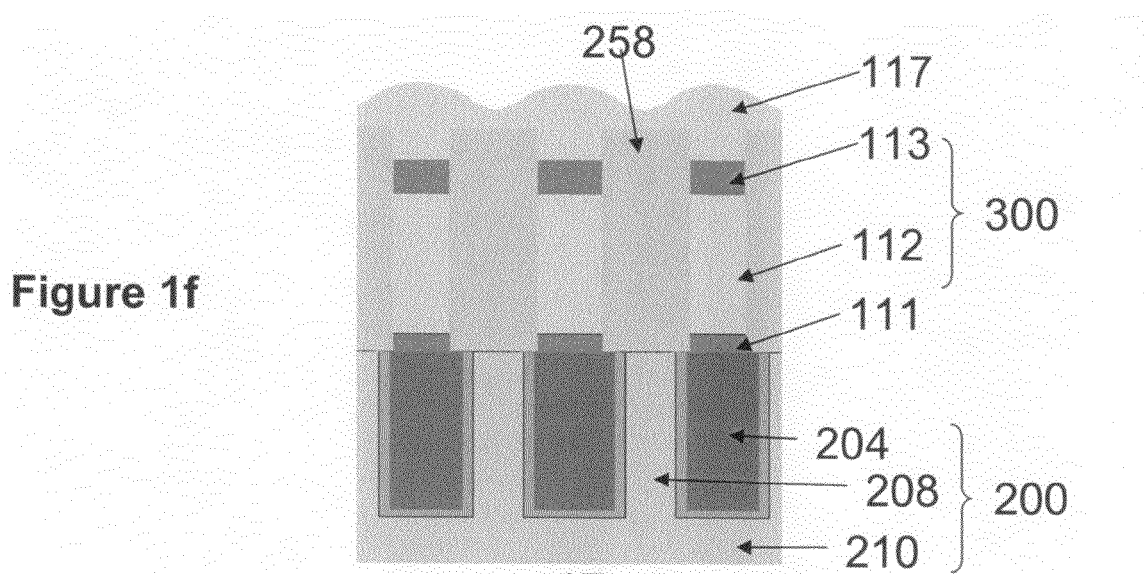

In some embodiments, the first conductivity type semiconductor material 113 may be a p-type semiconductor material that comprises upper portions of a plurality of diodes 300, as shown in FIG. 1*f*. In these embodiments, the seed material 111 may comprise a n-type material, and an optional intrinsic semiconductor material 112 may be formed over the seed material 111 prior to the step of forming the first conductivity type semiconductor layer 113. The intrinsic semiconductor layer comprises middle portions of the plurality of diodes 300, and the n-type seed material 111 comprises bottom portions of the plurality of diodes 300. In some embodiments the intrinsic middle portion of the diodes 300 may be omitted.

A second conductivity type semiconductor layer 117 may then be formed over the first conductivity type semiconductor layer 113, resulting in a structure as shown in FIG. 1*f*. When the layer 113 comprises p-type semiconductor material, the layer 117 may comprise either intrinsic semiconductor material or n-type semiconductor material.

Figure 1G:
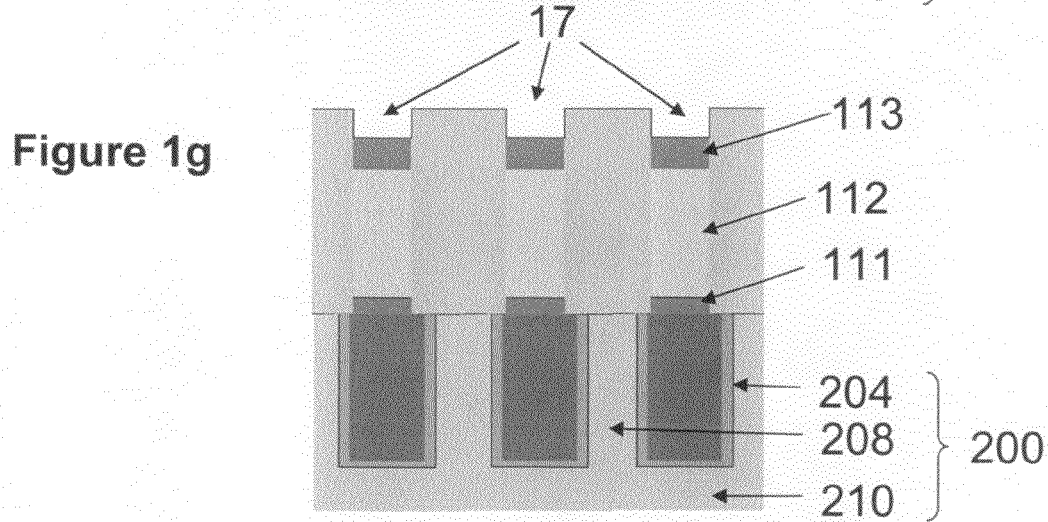

Turning to FIG. 1*g*, the second conductivity type semiconductor layer 117 is selectively etched using an upper surface of the first conductivity type semiconductor layer 113 as a stop to form a recess 17 in the plurality of openings. Any suitable methods that can selectively etch the intrinsic or n-type semiconductor layer 117 over the p-type semiconductor layer 113 may be used.

For example, the step of selectively etching the intrinsic or n-type semiconductor layer comprises KOH wet etching the intrinsic or n-type silicon semiconductor layer using the upper surface of the p-type silicon semiconductor layer as an etch stop. KOH wet etching may used to selectively etch n-type silicon (at a rate of greater than 1000 nm/min) or intrinsic silicon (at a rate of around 670 nm/min) because the etching rate of p-type silicon is significantly lower. Of course, any other selective etching methods may be used if desired.

In an alternative embodiment, the first conductivity type semiconductor layer 113 comprises an intrinsic silicon semiconductor layer, and the second conductivity type semiconductor layer 117 comprises an n-type silicon semiconductor layer. Similarly, KOH wet etching may be used to selectively etch the second conductivity type semiconductor layer 117 using the upper surface of the first conductivity type semiconductor layer 113 as a stop. In this alternative embodiment, dopants can then be implanted into an upper portion of the intrinsic semiconductor layer 113 to form a p-type or n-type region of a diode in the upper portion of the intrinsic semiconductor layer 113 after the step of selectively etching the second conductivity type semiconductor layer 117.

In this alternative embodiment, the intrinsic semiconductor layer (i.e., layer 113) may comprise middle portions of the plurality of diodes 300. An n-type semiconductor layer comprising lower portions of a plurality of diodes may be formed prior to forming the intrinsic semiconductor layer 113. The step of implanting dopants into the upper portion of the intrinsic semiconductor layer 113 forms a p-type semiconductor layer comprising upper portions of the plurality of diodes 300. Alternatively, a p-type semiconductor layer that comprises lower portions of a plurality of diodes 300 may be formed prior to forming the intrinsic semiconductor layer 113, while the step of implanting dopants into the upper portion of the intrinsic semiconductor layer 113 forms an n-type semiconductor layer comprising upper portions of the plurality of diodes 300. The formation of the upper portions of the diodes completes formation of diodes 300.

As explained above, the semiconductor device comprises a plurality of diodes 300 formed in the plurality of openings. Each of the diodes 300 comprises at least an n-type region and a p-type region located over the p-type region. In some embodiments, the diode may comprise an intrinsic semiconductor material located between the n-type and p-type regions. Of course, the intrinsic semiconductor (i.e., undoped) will never be perfectly electrically neutral, and will always have defects or contaminants that cause it to behave as if slightly n-doped or p-doped. Such a diode can be considered a p-i-n diode, for example a $P^+/N^-/N^+$, $P^+/P^-/N^+$, $N^+/N^-/P^+$ or $N^+/P^-/P^+$ diode can be formed.

In general, the diodes 300 preferably have a substantially cylindrical shape with a circular or roughly circular cross section having a diameter of 250 nm or less. The pitch and width of the diodes 300 are defined by the openings in the insulating layer, and can be varied as desired. In one preferred embodiment, the pitch of the diodes 300 (the distance from the center of one diode to the center of the next diode) is about 48 nm, while the width of the diodes 300 varies between about 24 and about 28 nm. In another preferred embodiment, the pitch of the diodes 300 is about 48 nm, while the width of the diode 300 varies between about 18 and 24 nm.

Figure 1H:
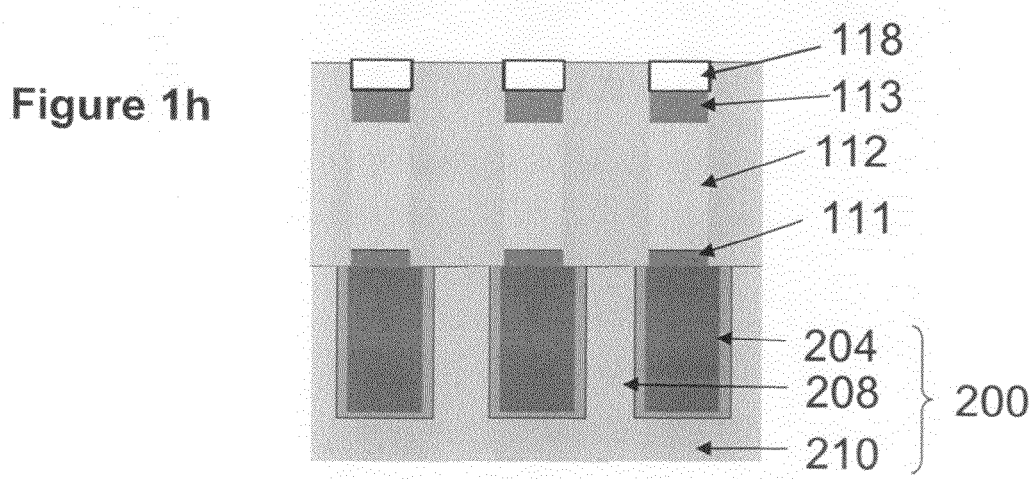

Next, a storage material layer 118 may be formed over the upper portions of diodes 300 (i.e. a p-type semiconductor layer 113, or p-type or n-type doped region by ion implantation of the upper portion of an intrinsic semiconductor layer 113) in the recess of the plurality of openings, resulting in a structure as shown in FIG. 1h. In some embodiments, the storage material 118 may be a storage element of a non-volatile memory device, while the layer 113 forms a part of a diode steering element 300 of the non-volatile memory device. The storage material layer 118 may comprise any suitable materials, such as an antifuse (i.e., antifuse dielectric), fuse, polysilicon memory effect material, metal oxide (such as nickel oxide, Perovskite materials, etc,), carbon nanotubes (single walled, multi-walled, or a mixture of single and multi-walled nanotubes), amorphous carbon, polycrystalline carbon, graphene resistivity switching material, phase change materials, switchable complex metal oxides, conductive bridge elements, or switchable polymers, etc.

Figure 3:
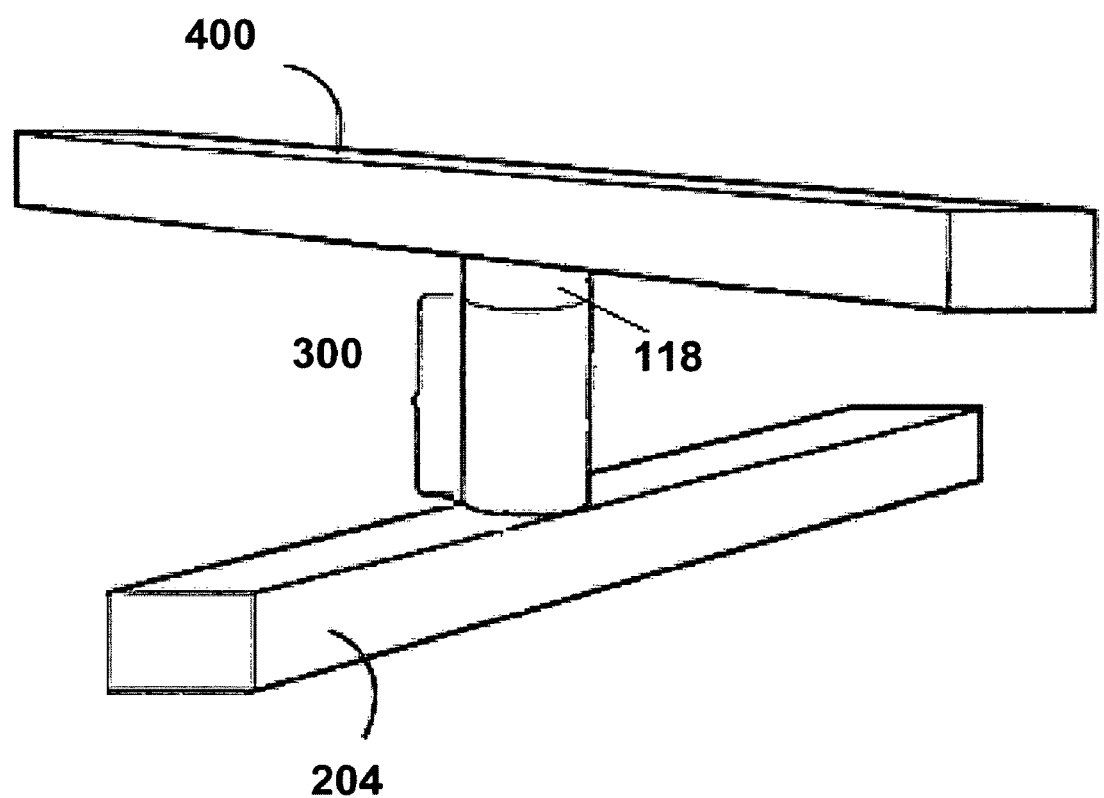
FIG. 3 is a three dimensional view of a completed non-volatile memory device according to some embodiments of the present invention.

Next, turning to a three dimensional view of the resulting device as shown in FIG. 3, upper electrodes 400 can be formed over the diodes 300, storage material 118 and the insulating layer (not shown). The upper electrodes may comprise a stack of conductive materials, for example, Ti (bottom)/Al/TiN (top), or Ti/TiN/Al/TiN, or Ti/Al/TiW, or any combination of these materials. The TiN or TiW layer on top can serve as an antireflective coating for patterning the conductor and as a polish stop material for subsequent CMP of an insulating layer, as will be described below. The upper electrodes 400 described above are patterned and etched using any suitable masking and etching technique to form substantially parallel, substantially coplanar conductor rails preferably extending perpendicular to the bottom electrodes 204.

Next, another insulating layer (not shown) is deposited over and between conductor rails 400. The insulating layer can be any known electrically insulating material, such as silicon oxide, silicon nitride, or silicon oxynitride. In a preferred embodiment, silicon oxide is used as this insulating material. This insulating layer can be planarized with the upper surface of the conductor rails 400 by CMP or etchback.

The semiconductor device may comprise a one-time programmable (OTP) or re-writable non-volatile memory cells. For example, each diode 300 may act as a steering element of a memory cell and the storage material 118 acts as a resistivity switching material (i.e., which stores the data by a permanent change in resistivity state after application of programming current or voltage) located in series with the diode 300 between the electrodes 204 and 400, as shown in FIG. 3.

In some embodiments, the pillar diode 300 itself may be used as the data storage device. In these embodiments, the resistivity of the diode 300 is varied by the application of a forward and/or reverse bias provided between the electrodes 204 and 400, as described in U.S. patent application Ser. No. 10/955,549 filed Sep. 29, 2004 (which corresponds to US Published Application 2005/0052915 A1) and U.S. patent application Ser. No. 11/693,845 filed Mar. 30, 2007 (which corresponds to US Published Application 2007/0164309 A1), both of which are incorporated by reference in their entirety. In this embodiment, the resistivity switching material 118 may be omitted if desired.

Optionally, one or more adhesion/barrier layers may be formed between some of the above described layers to improve the performance of the resulting device. Any suitable materials may be used as the optional adhesion/barrier layer (s), for example, transition metals, metal silicide, metal nitride, such as titanium, titanium silicide, titanium nitride, tungsten silicide, tungsten nitride, nickel silicide, or nickel nitride. For example, in one embodiment, a titanium nitride adhesion layer is formed between the storage material 118 and the diode 300.

One advantage of the selective etching of the semiconductor materials followed by storage material deposition into the recesses is to decrease or eliminate delamination of overlying materials from the storage material. In case of some storage materials, such as carbon storage materials for example, the adhesion of overlying layers to the storage material is lower than desired, which may lead to delamination of the overlying layer(s) from the storage material. This is exacerbated in peripheral area(s) (e.g., outside the area of the pillar shaped memory cells of FIG. 3) where the overlying layer(s) of large features contact a large continuous area of storage material.

Figure 4A:
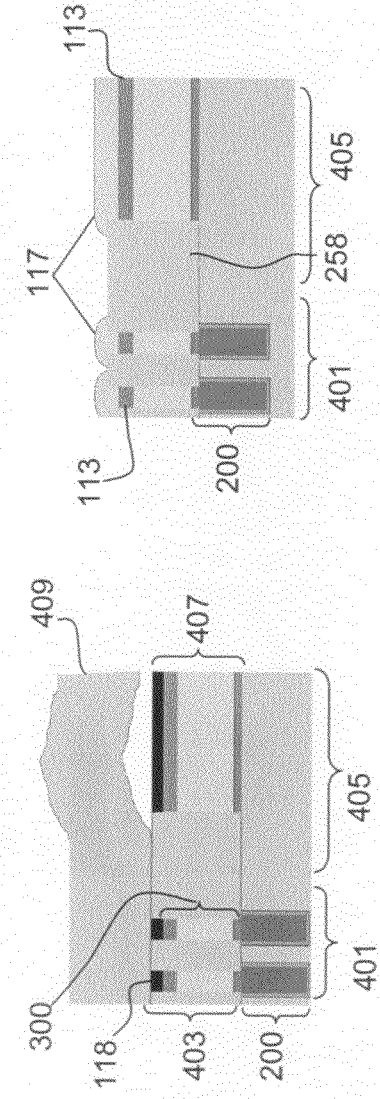
FIG. 4a is a side cross-sectional view of a prior art device.

FIG. 4a shows a prior art non-volatile memory device containing memory device area 401 containing a plurality of pillar shaped memory cells 403 and a peripheral area 405 containing a large device or contact 407. Each memory cell 403 contains the diode 300 and storage material 118 shown in FIG. 3. The prior art device does not utilize the selective etching and storage material deposition method described with respect to FIGS. 1e-1h above. As can be seen in FIG. 4a, the peripheral area 405 contains a large continuous area of storage material 118. The storage material 118 is a "dummy" storage material since it is formed incidentally during fabrication of the memory cells 403 and the material 118 in area 405 is not part of a memory cell. The large continuous area of storage material 118 in the peripheral area 405 may cause overlying layer(s) 409 (such as an upper electrode 400 or overlying insulating layer) to delaminate.

In contrast, as shown in FIGS. 4b-4f, if the selective etching and storage material deposition method described with respect to FIGS. 1e-1h above is used, then the delamination in the peripheral area 405 may be reduced or avoided since the method results in the removal of the storage material from the peripheral area.

Figure 4B:
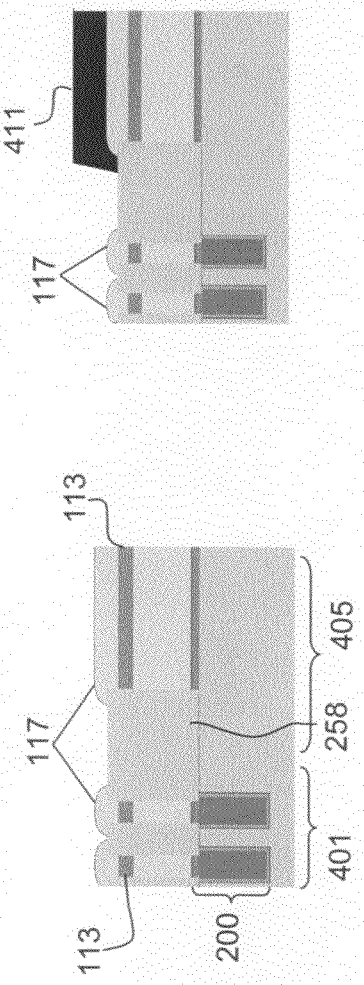
FIGS. 4b to 4f are side cross-sectional views illustrating stages in formation of a semiconductor device according to an embodiment of the present invention.

FIG. 4b corresponds to the step shown in FIG. 1f. In other words, the device area 401 shown in FIG. 4b corresponds to the device area shown in FIG. 1f. However, FIG. 4b also shows the peripheral area 405 in addition to the device area 401. As shown in FIG. 4b, the second conductivity semiconductor layer 117 is formed both in the recesses in insulating layer 258 above the first conductivity type semiconductor layer 113 in the device area 401, and over the first conductivity type semiconductor layer 113 in the peripheral area 405.

Figure 4C:
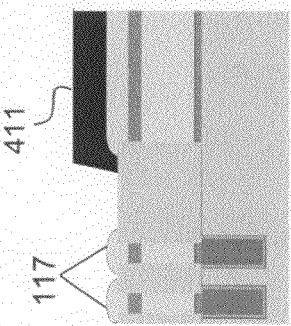
Figure 4D:
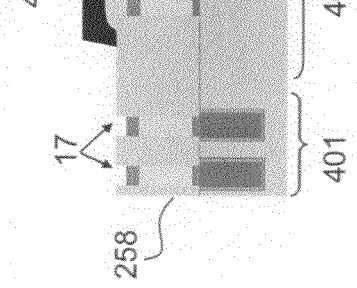

Then, as shown in FIG. 4c, a mask 411 is formed over the layer 117 in the peripheral region 405. The mask 411 may comprise a photoresist and/or hard mask or any other type of mask. After the mask 411 is formed in the peripheral region 405, the unmasked portion of layer 117 is selectively etched in the device area 401, as shown in FIGS. 1g and 4d to form the recesses 17. The mask 411 is then removed.

Figure 4E:
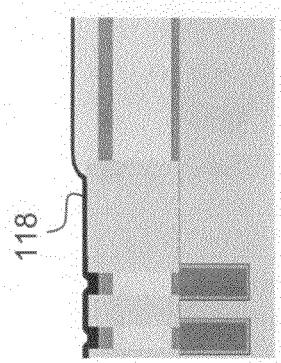
Figure 4F:
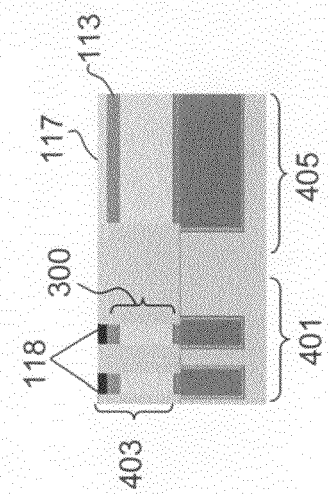

As shown in FIG. 4e, the storage material 118 is deposited in the device area 401 and the peripheral area 405. The storage material 118 is then planarized by CMP or other suitable planarization steps, as shown in FIGS. 1h and 4f. After the planarization, the storage material 118 remains in the recesses 17 in the device area 401. However, the storage material 118 is removed from the relatively planar peripheral area 405, exposing layer 117 in the peripheral area. The overlying layer(s) thus contact the semiconductor layer 117 rather than storage material 118 in the peripheral area 405 to decrease or prevent delamination.

FIGS. 5a-5h illustrate an alternative fabrication method in which the peripheral area 405 contains an array of cells 503 which include diodes 300 but not the storage (i.e., read/write) material 118, while the device area 401 includes an array of cells 403 which include both diodes and the storage material 118.

FIG. 5a corresponds to the step shown in FIG. 1f. In other words, the device area 401 shown in FIG. 5a corresponds to the device area shown in FIG. 1f. However, FIG. 5a also shows the peripheral area 405 in addition to the device area 401. As shown in FIG. 5a, the second conductivity semiconductor layer 117 is formed both in the recesses in insulating layer 258 above the first conductivity type semiconductor layer 113 in the device area 401 and in the peripheral area 405. Layer 117 is then planarized by CMP or other suitable methods in both areas 401 and 405, as shown in FIG. 5b.

Then, as shown in FIG. 5c, a mask 411 is formed over the layer 117 in the peripheral region 405. The mask 411 may comprise a photoresist and/or hard mask or any other type of mask. After the mask 411 is formed in the peripheral region 405, the unmasked portion of layer 117 is selectively etched in the device area 401, as shown in FIGS. 1g and 5d to form the recesses 17. The mask 411 is then removed.

As shown in FIG. 5e, the storage material 118 is deposited in the device area 401 and the peripheral area 405. The storage material 118 is located in recesses 17 in area 401. However, material 118 is located entirely over layer 117 in area 405 which lacks the recesses 17.

The storage material 118 is then planarized by CMP or other suitable planarization steps as shown in FIGS. 1h and 5f. After the planarization, the storage material 118 remains in the recesses 17 in the device area 401. However, the storage material 118 is removed from the planar peripheral area 405, exposing layer 117 in the peripheral area.

If desired, as shown in FIG. 5g the upper electrodes in cells 503 in the peripheral area 405 may be formed by ion implantation into the upper portion of the semiconductor layer(s) 117 and/or 113 to form highly doped semiconductor electrodes 500. For example, layer 117 may comprise an intrinsic (i.e., undoped) semiconductor material. During the implantation step, the device area 401 is masked with a mask 511, such as a resist and/or hard mask. After the implantation step, the mask 511 is removed as shown in FIG. 5h. The cells 503 in the peripheral area 405 may comprise cells in which the diode 300 acts as both a steering and storage element of a non-volatile memory device.

In an alternative embodiment shown in FIGS. 5i and 5j, the cells 503 in the peripheral area 405 may comprise non-volatile memory cells containing a diode steering element 300 and a storage element 518 which is different from the storage element 118 of the cells 403 in the device area 401. For example, storage element 518 may be a one time programmable storage element, such as a fuse or an antifuse (e.g., antifuse dielectric), which can be programmed only once. In contrast, storage element 118 may be a rewritable storage element which may be written and erased multiple times, such as a metal oxide (such as nickel oxide, Perovskite materials, etc,), carbon nanotubes (single walled, multi-walled, or a mixture of single and multi-walled nanotubes), amorphous carbon, polycrystalline carbon, graphene resistivity switching material, phase change materials, switchable complex metal oxides, etc. Alternatively, element 118 may be a one time programmable storage element and element 518 may be a rewritable storage element, or elements 118 and 518 may comprise different rewritable storage elements from the list of elements provided above (e.g., element 118 may comprise carbon nanotubes while element 518 may comprise amorphous carbon, etc.).

A method of making the device of the alternative embodiment is shown in FIGS. 5a to 5f and 5i to 5j. The method of the alternative embodiment proceeds in the same manner with respect to FIGS. 5a to 5f as the method of the previous embodiment. However, instead of forming a top electrode as shown in FIG. 5g, the second storage element is formed as shown in FIG. 5i. Specifically, to form an antifuse dielectric, the upper portion of the semiconductor layer 113 or 117 in area 405 is exposed to an oxygen and/or nitrogen atmosphere 514 at an elevated temperature, as shown in FIG. 5i. This converts the upper portion of the semiconductor layer 113 or 117 to an oxide, nitride or an oxynitride antifuse dielectric layer 518, as shown in FIG. 5j. If the semiconductor layer 113 or 117 comprises silicon, then the dielectric layer 518 comprises silicon oxide, silicon nitride or silicon oxynitride, depending on the ambient 514. The upper electrode is then formed by deposition over regions 401 and 405 after mask 511 is removed. Alternatively, rather than forming an antifuse dielectric layer by oxidation or nitridation of the exposed semiconductor material, the storage element 518 may be formed by depositing a layer of resistivity switching material, such as a metal oxide, carbon nanotube, amorphous carbon, etc., over the mask 511 and over the exposed semiconductor material 113 or 117. The mask 511 is then removed, lifting off the resistivity switching material layer 518 in area 401, but leaving it in place in region 405.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays. In contrast to the process described in Leedy, in an embodiment of the present invention, diodes share a conducting wire or electrode between two adjacent layers. In this configuration, the "bottom" diode will "point" in the opposite direction of the diode in the "upper" layer (i.e., the same conductivity type layer of each diode electrically contacts the same wire or electrode located between the diodes). With this configuration, the two diodes can share the wire between them and still not have a read or write disturb issue.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a non-volatile memory device, comprising:
   providing an insulating layer containing a plurality of openings in a device area;
   forming a first conductivity type semiconductor layer in the plurality of openings;
   forming a second conductivity type semiconductor layer, such that the second conductivity type semiconductor layer is formed in a peripheral area and over the first conductivity type semiconductor layer in the plurality of openings in the device area;
   masking the second conductivity type semiconductor layer in the peripheral area such that the second conductivity type semiconductor layer remains exposed in the device area;
   selectively etching the exposed second conductivity type semiconductor layer in the device area using an upper surface of the first conductivity type semiconductor layer as a stop to form a recess in the plurality of openings;
   forming a storage material layer, such that the storage material layer is located over the second conductivity type semiconductor layer in the peripheral area and over the first conductivity type semiconductor layer in the recessed plurality of openings; and
   planarizing the storage material layer to remove the storage material layer in the peripheral area, such that the storage material layer remains in the recessed plurality of openings to form storage elements of the non-volatile memory device.

2. The method of claim 1, wherein the first conductivity type semiconductor layer forms a part of a diode steering element of the non-volatile memory device.

3. The method of claim 1, wherein the peripheral area contains diode cells which lack the storage material layer.

4. The method of claim 1, wherein the peripheral area contains diode cells which comprise a storage material layer which is different from the storage material layer in the device area.

* * * * *